US012805031B2

(12) United States Patent
Zeng et al.

(10) Patent No.: US 12,805,031 B2
(45) Date of Patent: Nov. 17, 2026

(54) PLANAR INP-BASED SINGLE PHOTON AVALANCHE DIODE AND USE THEREOF

(71) Applicant: CHINA RESOURCES MICROELECTRONICS (CHONGQING) CO., LTD., ChongQing (CN)

(72) Inventors: Hongan Zeng, ChongQing (CN); Xuliang Yan, ChongQing (CN); Li Li, ChongQing (CN)

(73) Assignee: China Resources Microelectronics (Chongqing) Limited, ChongQing (CN)

(*) Notice: Subject to any disclaimer, the term of this patent is extended or adjusted under 35 U.S.C. 154(b) by 282 days.

(21) Appl. No.: 18/570,055

(22) PCT Filed: Jun. 21, 2022

(86) PCT No.: PCT/CN2022/100056
§ 371 (c)(1),
(2) Date: Dec. 13, 2023

(87) PCT Pub. No.: WO2023/040395
PCT Pub. Date: Mar. 23, 2023

(65) Prior Publication Data
US 2024/0282880 A1 Aug. 22, 2024

(30) Foreign Application Priority Data
Sep. 14, 2021 (CN) ........................ 202111076269.4

(51) Int. Cl.
*H10F 30/225* (2025.01)
*H10F 77/124* (2025.01)
*H10F 77/20* (2025.01)

(52) U.S. Cl.
CPC ..... *H10F 30/2255* (2025.01); *H10F 77/1248* (2025.01); *H10F 77/206* (2025.01)

(58) Field of Classification Search
None
See application file for complete search history.

(56) References Cited

FOREIGN PATENT DOCUMENTS

CN 103107231 A 5/2013
CN 107768462 A * 3/2018 ............ H10F 71/00
(Continued)

OTHER PUBLICATIONS

Machine Translation of CN 107768462 (Year: 2018).*

*Primary Examiner* — Anthony Ho
(74) *Attorney, Agent, or Firm* — IPRTOP LLC

(57) ABSTRACT

The present disclosure provides a planar InP-based single photon avalanche diode and use thereof, the isolation ring of the planar InP-based SPAD can effectively prevent the tunneling effect and reduce the dark count rate, thereby improving the device performance of the InP-based SPAD, shortening the period of the avalanche process, reducing the dark current, and enhancing quantum efficiency, as well as increasing the response frequency. Compared to traditional Si-based CMOS devices, InP material has an anti-radiation characteristic, making it more suitable for applications in the fields of aerospace communication and nuclear power. In addition, a planar electrode structure facilitates the formation of the contact layer and subsequent packaging, as well as integration with other devices or microcircuits.

12 Claims, 2 Drawing Sheets

(56) References Cited

FOREIGN PATENT DOCUMENTS

| | | | |
|---|---|---|---|
| CN | 110088916 | A | 8/2019 |
| CN | 110571300 | A | 12/2019 |
| JP | H10261813 | A | 9/1998 |

* cited by examiner

PLANAR INP-BASED SINGLE PHOTON AVALANCHE DIODE AND USE THEREOF

FIELD OF THE INVENTION

The present disclosure relates to the field of detectors, particularly to a planar InP-based single photon avalanche diode.

BACKGROUND OF THE INVENTION

Single photon avalanche diode (SPAD) is a single photon detector that can be widely used in a variety of weak-light detection scenarios and many applications such as LIDAR detection, atmospheric observation, and so on. Photodiodes typically are not very sensitive, therefore, when the light intensity is low enough, the signal will be submerged by noise. The avalanche diode, by applying a very high reverse bias voltage to the PN junction, allows the photon-excited charge carriers to be accelerated and gain enough energy to collide with the lattice to produce more secondary charge carriers. These new carriers are accelerated again and collide again to produce more carriers, thus allowing a very small optical signal to generate a very large current pulse. This process is similar to an avalanche, and that is why it is called an avalanche diode. In addition to photon-excited carriers triggering an avalanche, dark carriers generated by the thermal effect, tunneling effect, and potential-well trapping effect can also trigger an avalanche. This type of avalanche signal count is called a dark count, and the number of times the dark count occurs per unit time is a dark count rate. The dark count will affect the photon count, resulting in a distortion of the number of photons and the distribution of the photons obtained, so the dark count should be inhibited.

The InP-based SPAD is a photodetector that detects the near-infrared wavelength band, which is mainly used in the field of optical communication. In recent years, it has also been widely used in the field of quantum secure communication and 3D laser radar imaging. In 1988, Campbell designed an InP-based SPAD with a heterogeneous structure in which the absorber layer, transition layer, and multiplication layer are separated from each other. Specifically, the absorber layer is made of InGaAs and the multiplication layer is made of InP. InP-based SPAD with this structure ensures a high voltage of the InP multiplication layer and a relatively low electric field of the absorber layer at the same time, which overcomes the problem of large tunneling current caused by the small bandgap of previous homo-heterojunction InP-based SPADs. However, the above structure still has some problems. For example, when it is applied in quantum communication, due to the large dark count rate generated in the absorption layer of the InP-based SPAD and the immature process, some carriers will be trapped in the avalanche process, which will lengthen the relaxation distance and increase the relaxation time, thus ultimately leading to the appearance of an after pulsing in the device and further limiting the operating speed of the whole system. In addition, the commonly used electrode structure is vertical, which affects the formation of a contact layer and subsequent packaging, as well as integration with other devices or microcircuits.

Therefore, how to modify the structure of InP-based SPAD to eliminate the above defects is a pressing problem.

SUMMARY OF THE INVENTION

The present disclosure provides a planar InP-based SPAD and use thereof to solve the problems of high dark count rate, low quantum efficiency, and difficulties in integration with other devices of the conventional SPAD.

To realize the above object and other related objects, the present disclosure provides a planar InP-based SPAD, comprising:

an n-type InP substrate, with a main body region arranged on an upper surface of the n-type InP substrate; the main body region comprises an InP buffer layer, an InGaAs absorption layer, an InGaAsP transition layer, an InP charge layer, an InP multiplication layer, and a p-type InP diffusion layer which are sequentially stacked, and an isolation ring is provided to surround the periphery of the main body region.

In an embodiment, the n-type InP substrate is L-shaped, including a vertical substrate and a horizontal substrate; the main body region and the isolation ring are located on the upper surface of the horizontal substrate, and the vertical substrate is disposed on an outer side of the isolation ring.

In an embodiment, an n electrode and a p electrode are arranged on the surface of the vertical substrate and the p-type InP diffusion layer, respectively, so as to form a homolateral electrode.

In an embodiment, a contact layer is provided between the p-type InP diffusion layer and the p electrode to form an ohmic contact.

In an embodiment, a contact surface between the InP multiplication layer and the p-type InP diffusion layer is step-shaped.

In an embodiment, a thickness of the n-type InP substrate is in a range of 30-70 μm, and a doping concentration of the n-type InP substrate is in a range of 1e17-1e19 $cm^{-3}$; a thickness of the InP buffer layer is in a range of 0.2-0.9 μm, and a doping concentration of the InP buffer layer is in a range of 1e16-1e18 $cm^{-3}$; a thickness of the InGaAs absorption layer is in a range of 0.6-1.8 μm, and a doping concentration of the InGaAs absorption layer is in a range of 1e14-1e16 $cm^{-3}$; a thickness of the InGaAsP transition layer is in a range of 0.05-0.16 μm, and a doping concentration of the InGaAsP transition layer is in a range of 1e14-1e16 $cm^{-3}$; a thickness of the InP charge layer is in a range of 0.1-0.3 μm, and a doping concentration of the InP charge layer is in a range of 1e16-1e18 $cm^{-3}$; a thickness of the InP multiplication layer is in a range of 0.3-0.7 μm, and a doping concentration of the InP multiplication layer is in a range of 1e14-1e16 $cm^{-3}$; and a thickness of the p-type InP diffusion layer is in a range of 0.7-2 μm, and a doping concentration of the p-type InP diffusion layer is in a range of 1e17-1e20 $cm^{-3}$.

In an embodiment, a mass percentage of In in the InGaAs absorption layer is 0.53, and a mass percentage of Ga in the InGaAs absorption layer is 0.47.

In an embodiment, a mass percentage of In in the InGaAsP transition layer is 0.82, and a mass percentage of As in the InGaAsP transition layer is 0.4.

In an embodiment, the isolation ring has a shallow trench isolation (STI) structure, and a depth of the main body region is the same as that of the isolation ring. A width of the isolation ring ranges from 0.5 to 2 μm, and a depth of the isolation ring ranges from 2 to 5 μm.

The present disclosure further provides a use of InP-based single photon avalanche diodes, where the planar InP-based single photon avalanche diode is used in the fields of aerospace communication and nuclear power.

As described above, the present disclosure provides a planar InP-based single photon avalanche diode and use thereof, which has the following advantages: the isolation ring of the planar InP-based SPAD can effectively prevent the tunneling effect and reduce the dark count rate, thereby improving the performance of the InP-based SPAD, shortening the period of the avalanche process, reducing the dark current, and enhancing quantum efficiency, as well as increasing the response frequency. Compared to traditional Si-based CMOS devices, InP material has an anti-radiation characteristic, making it more suitable for applications in the fields of aerospace communication and nuclear power. In addition, a planar electrode structure facilitates the formation of the contact layer and subsequent packaging, as well as integration with other devices or microcircuits. The present disclosure effectively overcomes various shortcomings in the prior art and has high industrial utility value.

REFERENCE NUMERALS

Figure 1:
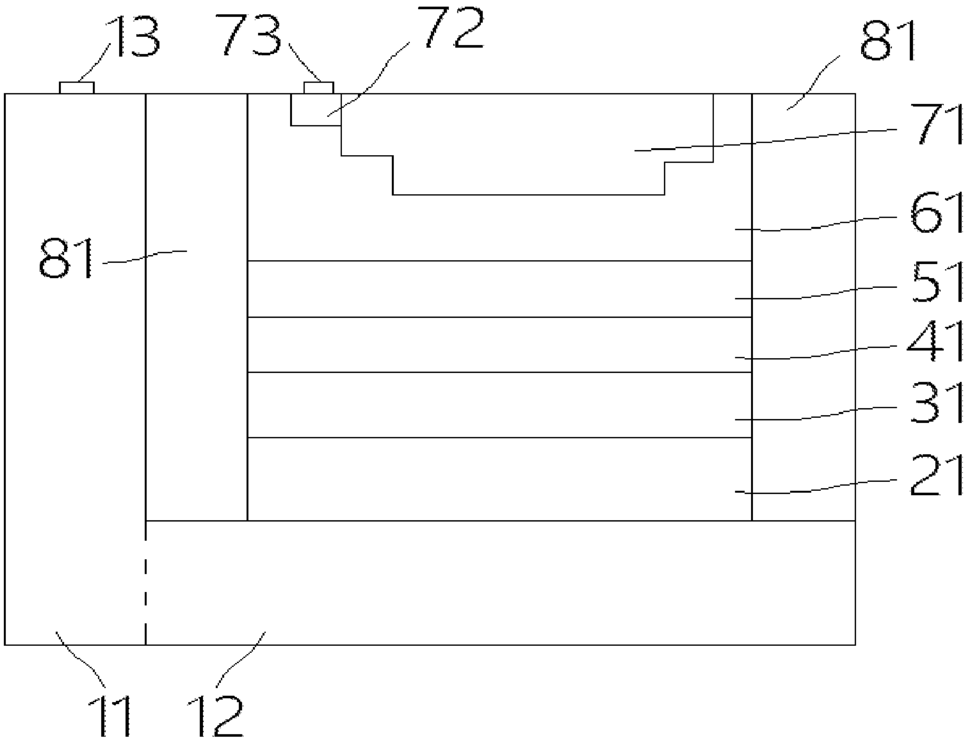
FIG. 1 shows a schematic structural diagram of a planar InP-based SPAD in the present disclosure.

21 InP buffer layer
31 InGaAs absorption layer
41 InGaAsP transition layer
51 InP charge layer
61 InP multiplication layer
71 p-type InP diffusion layer
81 Isolation ring
11 Vertical substrate
12 Horizontal substrate
13 n electrode
72 Contact layer
73 p electrode

DETAILED DESCRIPTION OF THE INVENTION

The following specific embodiments illustrate the implementation of the present disclosure, and those skilled in the art can easily understand other advantages and effects of the present disclosure from the contents disclosed in this specification. The present disclosure may also be implemented or applied through other different specific implementation modes. Various modifications or changes may be made to all details in the specification based on different points of view and applications without departing from the spirit of the present disclosure.

When describing the embodiments of the present disclosure, the cross-sectional view showing the structure of the device will not be partially enlarged to the general scale for convenience of description, and the schematic diagrams are only examples, which should not be regarded as limitations to the protection scope of the present disclosure. In addition, three-dimensional spatial dimensions of length, width, and depth should be included in the actual production.

For ease of description, spatial words such as “below”, “under”, “lower”, “beneath”, “on”, “above”, and the like may be used herein to describe the relationship of one shown element or feature to other elements or features in the drawings. It should be understood that these spatial relationship words are intended to include other directions of the device in use or operation, in addition to the directions depicted in the drawings. Further, when a layer is referred to as being “between” two layers, it may be the only layer between the two layers, or there may be one or more layers between the two layers. The “range from . . . to . . . ” used herein includes two endpoint values.

In the context of the present disclosure, the described structure of the first feature being “above” the second feature may include embodiments in which the first and second features are in direct contact, and may also include embodiments in which additional features are formed between the first and second features, such that the first and second features may not be in direct contact.

It needs to be stated that the drawings provided in the following embodiments are just used for schematically describing the basic concept of the present disclosure, thus only illustrating components related to the present disclosure and are not drawn according to the numbers, shapes, and sizes of components in actual implementation, the configuration, number, and scale of each component in the actual implementation thereof may be freely changed, and the component layout configuration thereof may be more complicated.

This embodiment provides a planar InP-based single photon avalanche diode as shown in FIG. 1. The InP-based SPAD includes an n-type InP substrate, and an upper surface of the n-type InP substrate is provided with a main body region, where the main body region includes an InP buffer layer 21, an InGaAs absorption layer 31, an InGaAsP transition layer 41, an InP charge layer 51, an InP multiplication layer 61, and a p-type InP diffusion layer 71 that are stacked in sequence.

Specifically, the InP-based SPAD is fabricated based on a deep sub-micron process, which can effectively improve the quantum efficiency compared to the Si-based SPAD. Meanwhile, the InP-based SPAD adopts an InP material system, which is more suitable for application in the field of aerospace communication, nuclear power, etc. due to its anti-irradiation characteristics compared to the traditional Si-based CMOS devices.

In an embodiment, an isolation ring 81 is provided around the periphery of the main body region. Preferably, the isolation ring 81 has the same depth as the main body region, i.e. the isolation ring 81 surrounds the entire main body region.

In an embodiment, a width of the isolation ring 81 is in a range of 0.5 to 2 μm, preferably is 1 μm; and a depth of the isolation ring 81 is in a range of 2 to 5 μm, preferably is 3.6 μm. The size of the isolation ring 81 is selected based on the 0.18 μm CMOS process, as well as the isolation effect on the PN junction.

In an embodiment, the isolation ring 81 is made of an insulating material, such as silicon oxide, silicon nitride, etc., and may have a shallow trench isolation (STI) structure. The method for forming an STI structure includes forming a trench by an etching process and then filling the trench with oxide to achieve electrical isolation. The isolation ring 81 prevents the tunneling effect and reduces the dark count rate, thus improving the device performance of the InP-based SPAD, achieving a shorter avalanche period, and lowering the dark current. The dark count rate reflects the interference of non-signaling optical (such as stray light) and electrical noise with the effective optical signal. Therefore, the dark count rate needs to be minimized in practice.

In an embodiment, the n-type InP substrate is L-shaped, including a vertical substrate 11 and a horizontal substrate 12. The main body region and the isolation ring 81 are located on the upper surface of the horizontal substrate 12, and the vertical substrate 11 is set on an outer side of the isolation ring 81.

In an embodiment, an n electrode 13 and a p electrode 73 are arranged on the surface of the vertical substrate 11 and the p-type InP diffusion layer 71, respectively, so as to form a homolateral electrode, that is, a planar electrode structure.

In an embodiment, a contact layer 72 is provided between the p-type InP diffusion layer 71 and the p electrode 73 to form an ohmic contact.

Specifically, the planar electrode structure facilitates the formation of the contact layer and subsequent packaging, as well as integration with other devices or microcircuits.

In an embodiment, a contact surface between the InP multiplication layer 61 and the p-type InP diffusion layer 71 is step-shaped, which increases the contact surface area and improves the multiplication effect.

In an embodiment, a method for preparing the InP-based SPAD includes depositing each function layer sequentially on the L-shaped n-type InP substrate to form the main body region, etching the periphery of the main body region to form an annular trench, and then filling the annular trench with insulating material, such as silicon oxide, silicon nitride, etc., to form the isolation ring 81.

In an embodiment, a thickness of the n-type InP substrate is in a range of 30-70 μm, preferably is 50 μm, and a doping concentration of the n-type InP substrate is in a range of 1e17-1e19 $cm^{-3}$, preferably is 1e18 $cm^{-3}$.

A thickness of the InP buffer layer 21 is in a range of 0.2-0.9 μm, preferably is 0.6 μm, and a doping concentration of the InP buffer layer 21 is in a range of 1e16-1e18 $cm^{-3}$, preferably is 1e17 $cm^{-3}$.

A thickness of the InGaAs absorption layer 31 is in a range of 0.6-1.8 μm, preferably is 1 μm, and a doping concentration of the InGaAs absorption layer 31 is in a range of 1e14-1e16 $cm^{-3}$, preferably is 1e15 $cm^{-3}$.

A thickness of the InGaAsP transition layer 41 is in a range of 0.05-0.16 μm, preferably is 0.1 μm, and a doping concentration of the InGaAsP transition layer 41 is in a range of 1e14-1e16 $cm^{-3}$, preferably is 1e15 $cm^{-3}$.

A thickness of the InP charge layer 51 is in a range of 0.1-0.3 μm, preferably is 0.2 μm, and a doping concentration of the InP charge layer 51 is in a range of 1e16-1e18 $cm^{-3}$, preferably is 1.8e17 $cm^{-3}$. The selection and optimization of the thickness and doping concentration can make the electric field more uniformly distributed and make the peak of the electric field appear in this layer and the distribution of the electric field in accordance with Poisson distribution model, which reduces the difficulty of the process, improves the frequency and responsiveness of the device, and is more conducive to the stability of the operating voltage and the matching of the circuit.

A thickness of the InP multiplication layer 61 is in a range of 0.3-0.7 μm, preferably is 0.5 μm, and a doping concentration of the InP multiplication layer 61 is in a range of 1e14-1e16 $cm^{-3}$, preferably is 1e15 $cm^{-3}$.

A thickness of the p-type InP diffusion layer 71 is in a range of 0.7-2 μm, preferably is 1.2 μm, and a doping concentration of the p-type InP diffusion layer 71 is in a range of 1e17-1e20 $cm^{-3}$, preferably is 1e19 $cm^{-3}$.

The specific thickness and doping concentration that are preferred are shown in Table 1 below.

TABLE 1

Thickness and doping concentration of each epitaxial layer

| Epitaxial layer | Thickness (μm) | Doping concentration ($cm^{-3}$) |
|---|---|---|
| p-type InP diffusion layer | 1.2 | $1 \times 10^{19}$ |
| InP multiplication layer | 0.5 | $1 \times 10^{15}$ |
| InP charge layer | 0.2 | $1.8 \times 10^{17}$ |
| InGaAsP transition layer | 0.1 | $1 \times 10^{15}$ |
| InGaAs absorption layer | 1 | $1 \times 10^{15}$ |
| InP buffer layer | 0.6 | $1 \times 10^{17}$ |
| n-type InP substrate | 50 | $1 \times 10^{18}$ |

In an embodiment, a mass percentage of In in the InGaAs absorption layer 31 is 0.53, and a mass percentage of Ga in the InGaAs absorption layer 31 is 0.47, that is, the InGaAs absorption layer 31 is made of $In_{0.53}Ga_{0.47}As$.

Specifically, $In_{0.53}Ga_{0.47}As$ is a direct bandgap material with a bandgap of 0.75 eV and an operating wavelength ranging from 0.9 μm to 1.7 μm.

In an embodiment, a mass percentage of In in the InGaAsP transition layer 41 is 0.82, and a mass percentage of As in the InGaAsP transition layer 41 is 0.4, that is, the InGaAsP transition layer 41 is made of $In_{0.82}GaAs_{0.4}P$. The In in the InGaAsP transition layer 41 provides a flatter surface formed during the deposition process and a greater residual stress.

Specifically, the InP-based SPAD has a planar structure, in which the n-type InP substrate is heavily doped and the InP buffer layer 21 is formed thereon to alleviate the internal stresses due to lattice mismatch. The n-type InGaAs absorption layer 31 ($In_{0.53}Ga_{0.47}As$) is weakly doped and used to absorb photons and generate electron-hole pairs.

The InGaAsP transition layer 41 is used as a gradient layer to reduce the bandgap difference between the InGaAs absorption layer 31 and the InP multiplication layer 61. The InP charge layer 51 is heavily doped and is used to regulate the electric field distribution between the InGaAs absorption layer 31 and the InP multiplication layer 61 to ensure that the InP multiplication layer 61 has a high electric field strength. The InP serves as material for the InP multiplication layer 61 and the p-type InP diffusion layer 71. The InP charge layer 51 and the InGaAsP transition layer 41 ensure that the InP multiplication layer 61 undergoes the multiplication effect.

Figure 2:
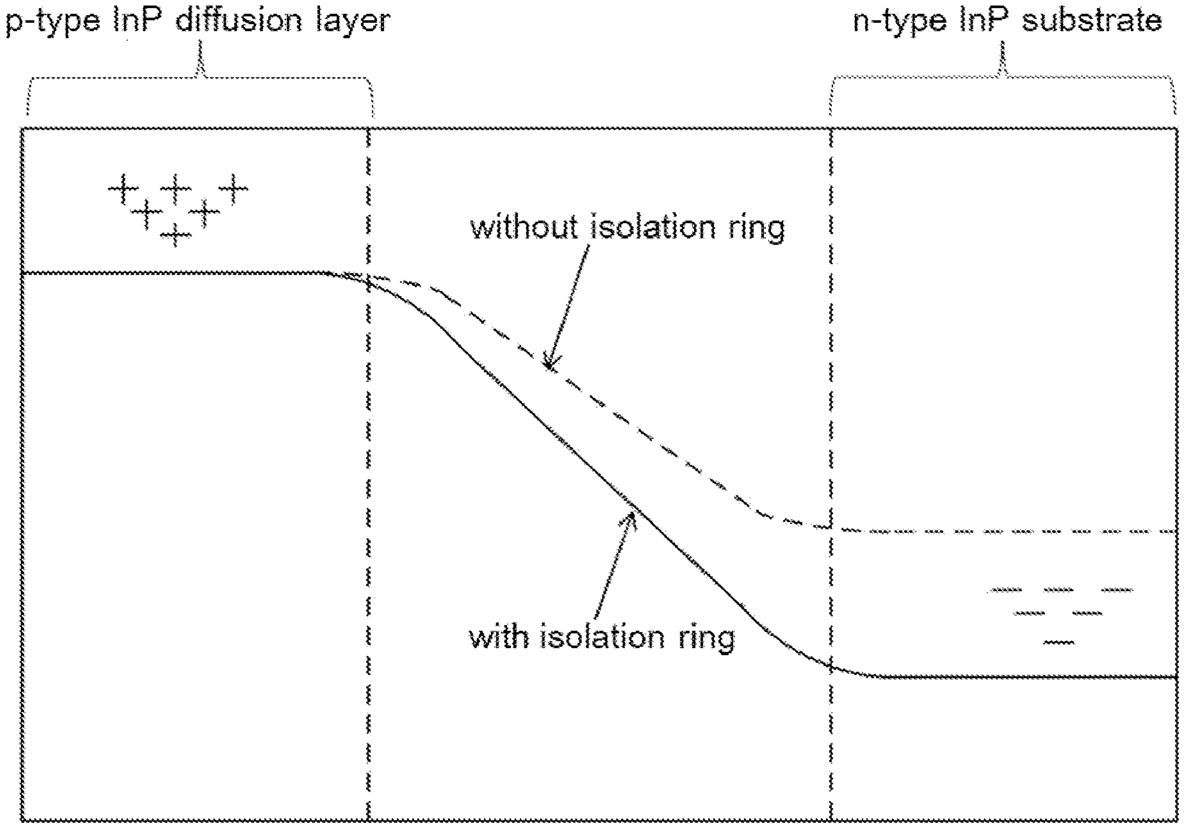
FIG. 2 shows a schematic diagram of an effect of an isolation ring on bands in the present disclosure.

Furthermore, as shown in FIG. 2, the compressive stress generated by the isolation ring 81 on each epitaxial layer causes the shape of the conduction and valence bands of the n-type InP substrate to change, resulting in a bending of the bands, an increase in energy splitting, an alteration of the number of carriers at each energy level, and consequently an increase in the effective mass of the electrons and holes. The compressive stress along the direction of a depletion layer (i.e., vertically upward) increases the effective mass of electrons and decreases the effective mass of holes. Since the mobility is inversely proportional to the effective mass, the electron mobility decreases, and the hole mobility increases, so that the diffusion of the electron carriers causing the dark current decreases, and thus lowering the dark count rate.

According to the description above, the present disclosure provides a planar InP-based single photon avalanche diode and use thereof, the isolation ring of the planar InP-based SPAD can effectively prevent the tunneling effect and reduce the dark count rate, thereby improving the device performance of the InP-based SPAD, shortening the period of the avalanche process, reducing the dark current, and enhancing quantum efficiency, as well as increasing the response frequency.

Compared to traditional Si-based CMOS devices, InP material has an anti-radiation characteristic, making it more suitable for applications in the field of aerospace communication and nuclear power. In addition, a planar electrode structure facilitates the formation of the contact layer and subsequent packaging, as well as integration with other devices or microcircuits.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge of the art without departing from the spirit and technical concept disclosed by the present disclosure shall be still covered by the claims of the present disclosure.

The invention claimed is:

1. A planar InP-based single photon avalanche diode, comprising an n-type InP substrate, wherein an upper surface of the n-type InP substrate is provided with a main body region, wherein the main body region comprises an InP buffer layer, an InGaAs absorption layer, an InGaAsP transition layer, an InP charge layer, an InP multiplication layer, and a p-type InP diffusion layer that are stacked in sequence, and an isolation ring is provided around the periphery of the main body region;

wherein the n-type InP substrate is L-shaped, comprising a vertical substrate and a horizontal substrate, wherein the main body region and the isolation ring are located on the upper surface of the horizontal substrate, and the vertical substrate is disposed on an outer side of the isolation ring.

2. The planar InP-based single photon avalanche diode according to claim 1, wherein an n electrode and a p electrode are arranged on the surface of the vertical substrate and the p-type InP diffusion layer, respectively, so as to form a homolateral electrode.

3. The planar InP-based single photon avalanche diode according to claim 2, wherein a contact layer is provided between the p-type InP diffusion layer and the p electrode to form an ohmic contact.

4. The planar InP-based single photon avalanche diode according to claim 1, wherein a contact surface between the InP multiplication layer and the p-type InP diffusion layer is step-shaped.

5. The planar InP-based single photon avalanche diode according to claim 1, wherein a thickness of the n-type InP substrate is in a range of 30-70 μm, and a doping concentration of the n-type InP substrate is in a range of 1e17-1e19 $cm^{-3}$;

a thickness of the InP buffer layer is in a range of 0.2-0.9 μm, and a doping concentration of the InP buffer layer is in a range of 1e16-1e18 $cm^{-3}$;

a thickness of the InGaAs absorption layer is in a range of 0.6-1.8 μm, and a doping concentration of the InGaAs absorption layer is in a range of 1e14-1e16 $cm^{-3}$;

a thickness of the InGaAsP transition layer is in a range of 0.05-0.16 μm, and a doping concentration of the InGaAsP transition layer is in a range of 1e14-1e16 $cm^{-3}$;

a thickness of the InP charge layer is in a range of 0.1-0.3 μm, and a doping concentration of the InP charge layer is in a range of 1e16-1e18 $cm^{-3}$;

a thickness of the InP multiplication layer is in a range of 0.3-0.7 μm, and a doping concentration of the InP multiplication layer is in a range of 1e14-1e16 $cm^{-3}$; and a thickness of the p-type InP diffusion layer is in a range of 0.7-2 μm, and a doping concentration of the p-type InP diffusion layer is in a range of 1e17-1e20 $cm^{-3}$.

6. The planar InP-based single photon avalanche diode according to claim 5, wherein the thickness of the n-type InP substrate is 50 μm, and the doping concentration of the n-type InP substrate is 1e18 $cm^{-3}$;

the thickness of the InP buffer layer is 0.6 μm, and the doping concentration of the InP buffer layer is 1e17 $cm^{-3}$;

the thickness of the InGaAs absorption layer is 1 μm, and the doping concentration of the InGaAs absorption layer is 1e15 $cm^{-3}$;

the thickness of the InGaAsP transition layer is 0.1 μm, and the doping concentration of the InGaAsP transition layer is 1e15 $cm^{-3}$;

the thickness of the InP charge layer is 0.2 μm, and the doping concentration of the InP charge layer is 1.8e17 $cm^{-3}$;

the thickness of the InP multiplication layer is 0.5 μm, and the doping concentration of the InP multiplication layer is 1e15 $cm^{-3}$; and the thickness of the p-type InP diffusion layer is 1.2 μm, and the doping concentration of the p-type InP diffusion layer is 1e19 $cm^{-3}$.

7. The planar InP-based single photon avalanche diode according to claim 1, wherein a mass percentage of In in the InGaAs absorption layer is 0.53, and a mass percentage of Ga in the InGaAs absorption layer is 0.47.

8. The planar InP-based single photon avalanche diode according to claim 7, wherein the InGaAs absorption layer is a direct bandgap material with a bandgap of 0.75 eV and an operating wavelength ranging from 0.9 μm to 1.7 μm.

9. The planar InP-based single photon avalanche diode according to claim 1, wherein a mass percentage of In in the InGaAsP transition layer is 0.82 and a mass percentage of As in the InGaAsP transition layer is 0.4.

10. The planar InP-based single photon avalanche diode according to claim 1, wherein the isolation ring has a shallow trench isolation (STI) structure, and a depth of the main body region is the same as that of the isolation ring, wherein a width of the isolation ring is in a range of 0.5-2 μm, and a depth of the isolation ring is in a range of 2-5 μm.

11. The planar InP-based single photon avalanche diode according to claim 10, wherein the width of the isolation ring is 1 μm, and the depth of the isolation ring is 3.6 μm.

12. A method of using the planar InP-based single photon avalanche diode according to claim 1, comprising:

using the planar InP-based single photon avalanche diode in the fields of aerospace communication and nuclear power.

* * * * *